United States Patent [19]

Picard

[11] Patent Number: 4,685,807

[45] Date of Patent: Aug. 11, 1987

[54] OPTICAL MICROLITHOGRAPHY APPARATUS WITH A LOCAL ALIGNMENT SYSTEM

[75] Inventor: Bernard Picard, St. Martin d'Hereés, France

[73] Assignee: Commissariat a l'Energie Atomique, France

[21] Appl. No.: 702,393

[22] Filed: Feb. 15, 1985

[30] Foreign Application Priority Data

Feb. 28, 1984 [FR] France ................................ 84 03027

[51] Int. Cl.⁴ ............................................ G01B 11/00
[52] U.S. Cl. .................................... 356/401; 356/399
[58] Field of Search ......................... 250/557; 355/53; 356/399, 400, 401

[56] References Cited

U.S. PATENT DOCUMENTS 3,751,170  8/1973  Hidaka ................................ 356/401
4,385,838  5/1983  Nakazawa et al. ................. 356/401
4,419,013  12/1983  Heimer ................................ 356/401

Primary Examiner—F. L. Evans
Attorney, Agent, or Firm—Cesari and McKenna

[57] ABSTRACT

An optical microlithography apparatus with a local alignment system is applicable to the production of integrated circuits. The local alignment system comprises a beam splitter between the photoreduction lens and the integrated circuit wafer, a sighting lens, an illumination source and an alignment pattern in the focal plane of the sighting lens. The source illuminates an area of the wafer around the position finding mark associated with each integrated circuit. The image of said mark is reflected into the focal plane of the sighting lens. A means then displaces the wafer in order to bring about coincidence between the image of the position finding mark and the alignment pattern.

6 Claims, 7 Drawing Figures

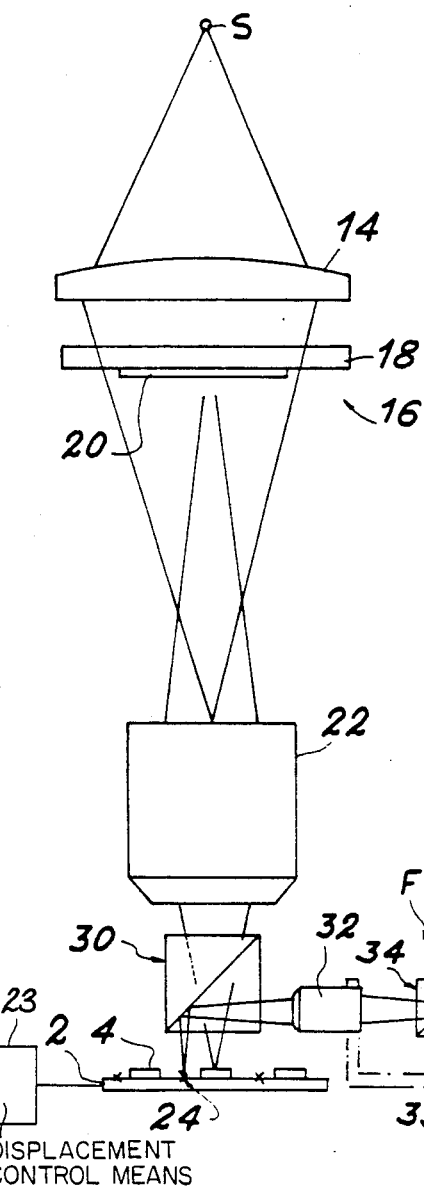
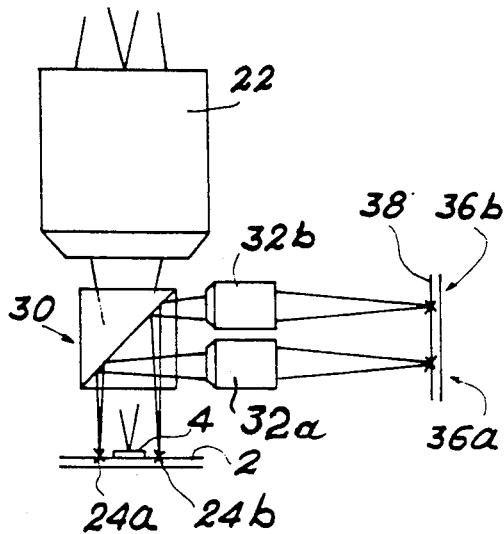
FIG. 3
FIG. 4

OPTICAL MICROLITHOGRAPHY APPARATUS WITH A LOCAL ALIGNMENT SYSTEM

BACKGROUND OF THE INVENTION

The present invention relates to an optical microlithography apparatus more particularly used for producing integrated circuits. It more specifically relates to the local alignment system.

It is known that an integrated circuit is produced by a succession of depositions of layers and the etching of said layers. In order to produce a pattern or motif by etching, the integrated circuit is covered with a photosensitive resin layer and said resin is irradiated with a high-energy beam, which is intercepted by a mask, which reproduces the image of the pattern to be produced in the integrated circuit. The irradiated resin is then removed, so that areas of the integrated circuit which are to be etched are left bare.

In the case of circuits with a minimum size of the pattern (width of metal conductors, length of MOS transistor channels, etc.) of roughly at least 3 $\mu$m, the most widely used method is to produce a scale 1 mask. This method, called 1:1 projection, is of interest because of its low cost and simplicity permitting a high production rate.

This simple method cannot be used for producing integrated circuits, whereof the typical pattern dimension is approximately 1 $\mu$m. Such circuits are mainly produced by two different methods, namely optical microlithography and electron beam microlithography.

The apparatus according to the invention is based on the first method. More specifically, it utilizes the direct step or wafer method, in which the ratio of the respective dimensions of the mask and an integrated circuit is approximately 10:1, so that a photoreduction lens is placed between them.

In order to successively position each integrated circuit of a wafer beneath the mask with a view to irradiating the same, the apparatus comprises a wafer displacement means. The integrated circuits are regularly arranged on the wafer, and said means brings about a displacement of the wafer by a constant distance between two irradiations. The displacement length can e.g. be controlled by a method utilizing the interference of laser beams.

Two known methods are used for aligning the integrated circuits of a wafer in the optical axis of the apparatus, and these two methods will be described with reference to FIGS. 1 and 2. These methods are respectively the overall alignment method and the local alignment method.

FIGS. 1a, 1b and 1c illustrate the overall alignment method of a wafer. FIG. 1a is a plan view of a wafer 2 having a plurality of rectangular zones 4, regularly positioned over the wafer. Successive layers will be deposited on said zones and then etched, so as to produce an integrated circuit. Throughout the remainder of the present text, these zones will be called chips.

Apart from these chips, wafer 2 also has position finding marks 6, which are used for aligning the wafer. These marks can be formed by a single line, as shown in the drawing, or can be two-dimensional, e.g. in the form of a cross. In the first case, at least two marks are necessary for positioning the wafer in translation and in rotation, whilst in the second, a single mark is sufficient.

The wafer is aligned by an optical system, diagrammatically indicated by FIG. 1b. The optical system shown comprises two corner mirrors 8, a prism 10 and an alignment microscope 12. This optical system is connected to a means 23 (FIG. 3) controlling the displacement of the wafer support in such a way that the position finding marks occupy reference positions.

The wafer is then translated, so as to be positioned beneath the optical column of the microlithography system. This optical system comprises a monochromatic light source S, a convergent lens 14, a reticle 16 constituted by a glass plate 18, on whose lower face is formed a mask 20 by deposition and then etching of a metal sheet, and a photoreduction lens 22. Each chip 4 of wafer 2 is successively irradiated.

The correct pre-irradiation of alignment of a chip 4 before irradiation is not checked for all chips. This saves time and consequently leads to a high production rate, but also leads to a significant tolerance in the alignment of the different layers forming the chip. In the case of known machines, this alignment offset is approximately 0.7 $\mu$m, and is largely due to the displacement of the wafer from the alignment system to the optical microlithography system, said displacement being roughly 100 mm long.

This 0.7 $\mu$m tolerance in the alignment of the chips makes it impossible to produce patterns with a size less than 2 $\mu$m. For finer or more detailed lithography, it is necessary to use an apparatus equipped with a local alignment system, i.e. a system making it possible to realign each chip of the wafer prior to irradiation. Such an apparatus is diagrammatically shown in FIGS. 2a and 2b.

FIG. 2a shows in plan view a wafer 2 with a plurality of chips 4. A position finding mark 24 is placed alongside each chip. These marks make it possible to individually align each chip beneath the optical microlithography system. These marks can have one dimension, e.g. a line, or two dimensions, e.g. a cross.

The optical microlithography system of FIG. 2b has the same elements as that of FIG. 1c, i.e. a monochromatic source 8, a convergent lens 14, a reticle 16 constituted by a glass plate 18 and a mask 20 as well as a lens 22.

A reference mark 26 has been added to plate 18 alongside mask 20. This mark is projected by photoreduction lens 22 on to wafer 2. The correct alignment of a chip of the wafer is brought about by making the projection of the mark 26 coincide with the position finding mark 24, of the chip positioned beneath the photoreduction lens. The image of mark 26 on wafer 2 and the surrounding area is reflected by a beam splitter 28 positioned between reticle 16 and the photoreduction lens 22 for analysis purposes. A displacement means then controls the movement of the wafer, as a function of signal 29, so as to correctly align the chip 4 to be irradiated.

The local alignment permits a better accuracy in the superimposing of the different layers of a chip. The alignment precision is in this case approximately 0.1 $\mu$m, which is much better than that in the apparatuses equipped with an overall alignment system. It is therefore possible to produce integrated circuits, whereof the minimum size of the patterns is approximately 1 $\mu$m.

It is clear that the alignment of each chip is prejudicial to the production rate of the integrated circuit compared with overall alignment. In order not to excessively limit this production rate, realignment only takes place every n chips and not every chip, the value of n being chosen as a function of the characteristics of the apparatus.

The local alignment system of the apparatus shown in FIG. 2b is not perfect. A first limitation of this system results from the fact that the photoreduction level 22 is only corrected for a specific wavelength, which is that of the monochromatic source S. Thus, a correct alignment cannot be obtained with said source. This is prejudicial, because the position finding mark 24 is located in the field of the photoreduction lens 22 and is consequently subject to the action of the radiation from source S.

In addition, according to the technological levels, the position finding mark 24 does not have a very good contrast, which makes the alignment of the associated chip difficult.

The local alignment system of the apparatus according to the invention obviates these problems by permitting the illuminating of mark 24 by a wide spectrum optical beam, or by the choice of a monochromatic beam, whose wavelength can be chose from among a large number thereof.

Among the available lighting sources, it is therefore advantageously possible to use a wavelength, to which the resin covering the chip is insensitive.

The photoreduction lens, which is free from aberrations for a single wavelength, is not compatible with the lighting source according to the invention. Moreover, a photoreduction lens free from aberrations for one wavelength range is substantially impossible to produce with the present state of the art.

It is therefore proposed to arrange a beam splitter between the photoreduction lens and the wafer in order to illuminate the latter, without utilizing the mean s of the optical microlithography system.

This beam splitter also has the function of reflecting the image of the area surrounding the position finding mark of the chip to be irradiated said image then being processed by a means controlling the displacement of the wafer in order to bring about the alignment of the chip to be irradiated.

SUMMARY OF THE INVENTION

More specifically, the present invention relates to an optical microlithography apparatus comprising a support receiving a wafer over which are distributed the chips to be irradiated, each chip being provided with at least one position finding mark, the apparatus further comprising an optical system and a system for the local alignment of the wafer, said optical system comprising a radiation source, a convergent lens, a reticle and a photoreduction lens for displaying the image of the reticle on a chip of the wafer, wherein the said local alignment system comprises a beam splitter between the photoreduction lens and and wafer, a source for illuminating the wafer by said beam splitter, means for collecting the image of the illuminated area around the position finding mark by said beam splitter, an alignment pattern and a means for controlling the displacement of the wafer support for aligning the image of the position finding mark on the alignment pattern.

The photoreduction lens is not used by the alignment system. The light from the illumination source is only transmitted and deflected by the beam splitter and the image of the chip collected after reflection of said light is only transmitted and deflected by the beam splitter.

According to the invention, the illumination source can either be of the wide spectrum type, or monochromatic. A monochromatic source can in particular be obtained by interposing a filter on the path of a wide spectrum beam.

According to another feature of the invention, the alignment system comprises two alignment patterns and two means for collecting the image of two position finding marks associated with a chip, the displacement means displacing the wafer in order to align each position finding mark with an alignment pattern.

According to another feature of the invention, each means for collecting the image of the position finding mark is a sighting lens having the alignment pattern in its focal plane.

BRIEF DESCRIPTION OF THE DRAWINGS

The invention is described in greater detail hereinafter relative to non-limitative embodiments and the attached drawings, wherein show:

FIG. 3 diagrammatically, an optical microlithography apparatus equipped with a local alignment system according to the invention.

FIG. 4 diagrammatically another embodiment of the local alignment system of an optical microlithography apparatus according to the invention.

DETAILED DESCRIPTION OF THE PREFERRED EMBODIMENTS

Figure 1A:
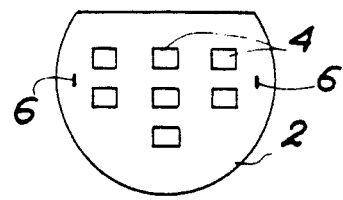
FIGS. 1a, 1b and 1c already described, diagrammatically illustrate an optical microlithography apparatus equipped with an overall alignment system according to the prior art.
Figure 2A:
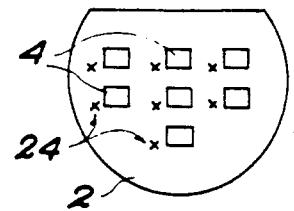
FIGS. 2a and 2b already described, illustrate an optical microlithography apparatus equipped with a local alignment system according to the prior art.
Figure 1B:
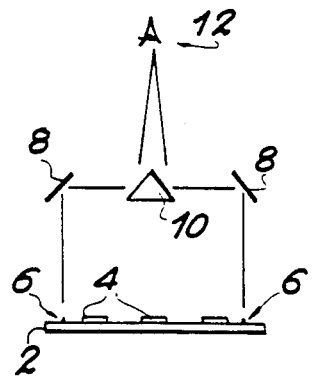
Figure 1C:
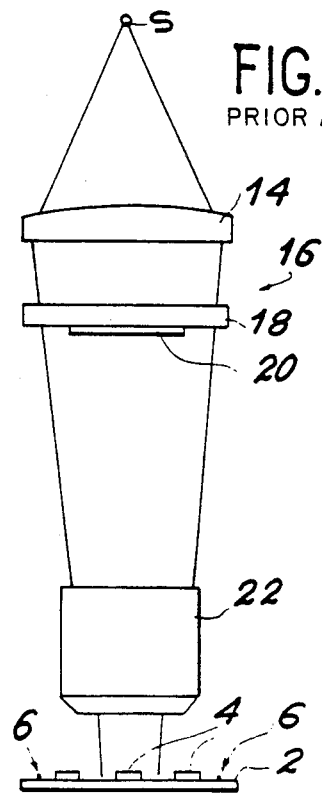
Figure 2B:
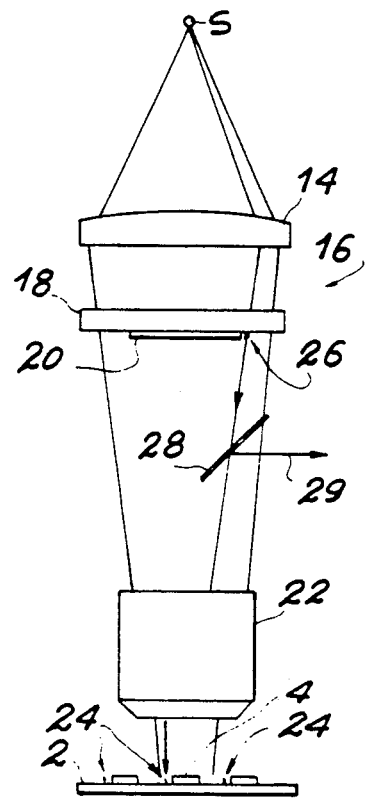

The optical microlithography system of the apparatus shown in FIG. 3 is of a conventional nature. It comprises a monochromatic source S, a convergent lens 14, a reticle 16 formed by a glass plate 18 on the lower face of which is etched a mask 20, and a photoreduction lens 22. A known displacement control means 23 successively positions each chip 4 of wafer 2 in the axis of the optical microlithography system in order to irradiate the same.

According to the invention, the local alignment system of the optical microlithography apparatus comprises a beam splitter 30 placed in the axis of the optical system between the photoreduction lens 22 and the wafer 2, a sighting lens 32 for collecting the image of the area of the wafer and centered on the position finding mark 24 associated with the chip 4 to be irradiated, an illumination source S', a second beam splitter 34 and an alignment pattern 36.

The beam splitter 30 can in particular be a cubic beam splitter or a dichroic mirror. Beam splitter 30 forms, together with the photoreduction lens 22, an optically and mechanically undividable entity.

This has the advantage that the irradiation can continue through said beam splitter, between two adjustment sightings by the alignment system, without there being any mechanical displacement of said beam splitter. This increases the chip irradiation range.

The beam splitter 30 can also comprises a retractable mirror. In this case, it may be necessary to displace the mirror in order to permit irradiation. Thus, the chip irradiation rate is lower.

Lens 14, photoreduction lens 22 and beam splitter 30 are aligned with the optical axis of the apparatus and are fixed with respect thereto. The reticle is aligned in per se known manner by bringing about coincidence between the position finding marks on said reticle and the position finding marks on the not shown reticle holder.

In order to position the chip 4 to be irradiated, wafer 2 is illuminated by source S' of the local alignment system, the beam of source S being hidden. The sighting lens 32 has two degrees of freedom in translation in the plane perpendicular to the axis of the optical microlithography system. It is displaced in per se known manner either manually, or automatically, so that the position finding mark 24 associated with chip 4 falls in its field of vision. The alignment patter 36 follows the displacements of the sighting lens, e.g. while being integral with said sighting lens via a frame 33, so as to be maintained in the focal plane 35 of said sighting lens 32. Ancillary, not shown optical means make it possible for the beam from source S' to illuminate wafer 2 via beam splitter 34 and lens 32, no matter what the position of the latter.

Chip 4 is aligned by comparing the position of the alignment patter 36 and the image of the position finding mark 24 in the focal plane of the sighting lens 32. A means controls the displacement of the wafer in order to bring about conincidence of said two marks. Comparison of the position of the alignment pattern and the image of the position finding mark can be carried out by any known process. This can in particular be a photometric process, if the position finding mark and the alignment pattern are respectively a male cross and a female cross, or a correlation process can be used if both the position finding mark and the alignment pattern are in each case.

According to the invention, the illumination source S' can be monochromatic or of the wide spectrum type. Thus, the illumination source can be chosen in accordance with the technological level, so as to always have a high contrast position finding mark 24. A simple embodiment of this polyvalent illumination source S' consists of using a wide spectrum source S', e.g. with a wavelength between 300 and 800 nanometers, as well as a system of detachable filters which intercept the beam from source S'. For example, as shown in FIG. 3, said filters F can be distributed over the periphery of a disk D, whose rotation about an axis A makes it possible to position any filter in front of source S'.

The use of such a source S' which is not monochromatic and of a fixed wavelength is only possible if the sighting lens 32 is corrected for aberrations for all the wavelengths, which can easily be brought about, because the sighting lens is a relatively simple optical system.

The local alignment system of the apparatus shown in FIG. 3 makes it possible to align wafer 2 in translation, the alignment in rotation being carried out once and for all at the start of irradiation. In certain cases, e.g. when the mask is very complex, it can be of interest to be able to realign each wafer chip in rotation prior to irradiation. This can be carried out with two position finding marks located at the two ends of each chip.

The alignment in rotation and in position can also be brought about if two position finding marks are associated with each chip 4 of wafer 2 and if the local alignment system has two sighting lenses for projecting the image of each of these marks to alignment patterns. FIG. 4 diagrammatically illustrates such an alignment system. FIG. 4 shows the lower part of the optical microlithography system comprising the photoreduction lens 22 and the beam splitter 30.

Each chip 4 of wafer 2 is provided with two position finding marks 24a, 24b. By means of two sighting lenses 32a, 32b, the not shown illumination source illuminates the areas positioned around the position finding marks 24a, 24b and reflects the image of these areas on to plane 38, located in the focal plane of the sighting lenses 32a and 32b, on which are inscribed two alignment patterns 36a, 36b.

It is obvious that in the two embodiments of the apparatus according to the invention, the alignment can be carried out for each chip or only for every n chips in which n is an integer equal to or exceeding 1.

What is claimed is:

1. An optical microlithography apparatus comprising a displacable support receiving a wafer over which are distributed chips to be irradiated, each chip being provided with at least one position finding mark, said apparatus further comprising an optical system and a system for the local alignment of the wafer, said optical system comprising a radiation source, a convergent lens, a reticle and a photoreduction lens for displaying the image of the reticle on a chip of the wafer, wherein the said local alignment system comprises a beam splitter between the photoreduction lens and the wafer, a source for illuminating the wafer by said beam splitter, means for collecting the image of the illuminated area around the position finding mark by said beam splitter said collecting means having a focal plane, an alignment pattern located in the focal plane of said collecting means and a means for controlling the displacement of the wafer support for aligning the image of the position finding mark on the alignment pattern.

2. An optical microlithography apparatus according to claim 1, wherein the illumination source supplies a monochromatic beam.

3. An optical microlithography apparatus according to claim 1, wherein the illumination source supplies a wide spectrum beam.

4. An optical microlithography apparatus according to claim 3, wherein said apparatus comprises at least one detachable filter, which intercepts the beam from the illumination source.

5. An optical microlithography apparatus according to claim 1 adapted for a wafer in which at least a second position finding mark is associated with each chip of said wafer, wherein said apparatus comprises second means for collecting the image of the illuminated area around said second position finding mark, the focal plane of said second means for collecting being the same as the focal plane of the means for collecting, and a second alignment pattern located in the focal plane of said second means for collecting, the displacement means controlling the displacement of the wafer support in order to align both position finding marks with an alignment pattern.

6. An optical microlithography apparatus according to claim 5, wherein each means for collecting the image of the illuminated area around a position finding mark is a sighting lens, an alignment pattern being located in the focal plane of each of said sighting lenses.

* * * * *